_(12)_ United States Patent
Atkins et al.

(10) Patent No.: US 7,497,086 B2
(45) Date of Patent: Mar. 3, 2009

(54) METHOD AND APPARATUS FOR MAINTAINING APPARATUS AT CRYOGENIC TEMPERATURES OVER AN EXTENDED PERIOD WITHOUT ACTIVE REFRIGERATION

(75) Inventors: Andrew Farquhar Atkins, Oxon (GB); Graham Gilgrass, Wallingford (GB); Wolfgang Stautner, Oxford (GB)

(73) Assignee: Siemens Magnet Technology Ltd., Witney (GB)

( * ) Notice: Subject to any disclaimer, the term of this patent is extended or adjusted under 35 U.S.C. 154(b) by 260 days.

(21) Appl. No.: 11/349,207

(22) Filed: Feb. 8, 2006

(65) Prior Publication Data

US 2006/0288731 A1      Dec. 28, 2006

(30) Foreign Application Priority Data

Mar. 23, 2005  (GB) ................................. 0505904.3
Aug. 3, 2005   (GB) ................................. 0515936.3

(51) Int. Cl.
    *F17C 7/00*  (2006.01)
(52) U.S. Cl. ...................... 62/50.1; 62/457.9
(58) Field of Classification Search ................ 62/457.9, 62/371, 48.1, 50.1, 50.2, 50.7, 47.1; 220/901; 335/299, 300, 296, 216

See application file for complete search history.

(56) References Cited

U.S. PATENT DOCUMENTS

| 3,191,795 | A | * | 6/1965 | Molnar | 220/560.1 |
| 3,698,200 | A | * | 10/1972 | Johnson et al. | 62/50.2 |
| 4,212,169 | A | | 7/1980 | Kneip, Jr. | |
| 4,510,771 | A | | 4/1985 | Matsuda et al. | |
| 5,063,651 | A | * | 11/1991 | Kneip et al. | 29/455.1 |
| 5,187,938 | A | * | 2/1993 | Mraz et al. | 62/51.1 |
| 5,201,184 | A | * | 4/1993 | Roth | 62/47.1 |
| 5,381,666 | A | * | 1/1995 | Saho et al. | 62/47.1 |
| 5,404,726 | A | * | 4/1995 | Janssen | 62/295 |
| 5,442,928 | A | * | 8/1995 | Laskaris et al. | 62/51.1 |
| 5,613,367 | A | * | 3/1997 | Chen | 62/47.1 |
| 5,831,489 | A | * | 11/1998 | Wire | 333/99 S |
| 6,107,905 | A | * | 8/2000 | Itoh et al. | 335/216 |
| 6,172,588 | B1 | * | 1/2001 | Laskaris et al. | 335/299 |
| 7,043,925 | B2 | * | 5/2006 | Haberbusch | 62/6 |

* cited by examiner

*Primary Examiner*—Mohammad M Ali
(74) *Attorney, Agent, or Firm*—Crowell & Moring LLP

(57) ABSTRACT

The present provides a cryogenic thermal battery arrangement for maintaining a superconducting magnet coil or similar apparatus at cryogenic temperature for a required shipping period, such as thirty days, without consuming a significant amount of costly cryogen. According to another aspect, the invention allows extended shipping periods without incurring excessive costs.

17 Claims, 4 Drawing Sheets

METHOD AND APPARATUS FOR MAINTAINING APPARATUS AT CRYOGENIC TEMPERATURES OVER AN EXTENDED PERIOD WITHOUT ACTIVE REFRIGERATION

The present invention relates to a thermal battery, that is, a device which serves to hold a piece of equipment at a certain temperature without external refrigeration and despite a relatively elevated ambient temperature.

BACKGROUND OF THE INVENTION

Superconducting magnets are well known and used for producing very high strength magnetic fields in applications such as magnetic resonance imaging. The superconducting magnet is typically made up of a number of coils of superconducting wire which, in use, must be held at cryogenic temperatures typically of the order of 4K, the boiling point of liquid helium. Alternatively, systems using so-called high temperature superconductors are known. These may operate at the temperature of boiling neon, hydrogen or nitrogen. Critical temperatures in the region of 18-80K are typical for such materials. While the present invention will be described with particular reference to systems operating at about 4K, which are cooled by boiling helium, the present invention may be applied to high temperature superconducting arrangements.

A typical arrangement has superconducting coils immersed in a bath of liquid cryogen, for example helium. The liquid cryogen is allowed to boil, and maintains the coils at a steady temperature of its boiling point, about 4K in the case of helium. A recondensing refrigerator is provided, and provides cooling by recondensing the boiled-off cryogen vapour back into a liquid. Thus, the overall consumption of liquid cryogen is reduced to a low value, since most if not all of the boiled off cryogen is recondensed back into liquid form within the cryogen vessel. Cryogens other than helium may of course be used, depending on the cryogenic temperature required.

FIG. 1 shows a cross-section of a former 10 and superconducting coils 12 mounted thereon, typical of a solenoidal superconducting magnet for MRI or NMR imaging systems. The former 10 and coils 12 are housed within a cryogen vessel 14. The cryogen vessel 14 is typically partially filled with a liquid cryogen, not shown in the drawing. The cryogen vessel itself is housed within an outer vacuum chamber 16, and the space between the cryogen vessel 14 and the outer vacuum chamber 16 is evacuated. A thermal shield 18 is typically also provided, in the evacuated space between the cryogen vessel and the outer vacuum container. This shield reduces the incidence of radiated heat from the outer vacuum chamber which may reach the cryogen vessel. A service neck 20 is typically included. In operation, this neck may house a recondensing refrigerator.

A difficulty arises when the system is in transit, awaiting installation. Typically, the system is transported filled with liquid cryogen, but the recondensing refrigerator is unable to operate due to the absence of a suitable power source, or due to regulatory restrictions. During the transit time, the cryogen is allowed to boil, keeping the coils 12 at the required cryogenic temperature. The cryogen thus acts as a thermal battery. Service neck 20 provides an escape path for boiled off cryogen to leave the cryogen vessel 14. The boiled off cryogen is allowed to vent to atmosphere. The system may be required to be capable of remaining in this boiling thermal battery state for a duration of up to about 30 days. When a cryogen such as helium or neon is used, the cost of the cryogen lost by boiling may become significant. When hydrogen is used a cryogen, an explosion risk may result.

It is required to keep the coils at a cryogenic temperature, since otherwise the commissioning of the system on installation becomes expensive, difficult and time consuming. If the system has heated up to ambient temperature, which will happen if the liquid cryogen boils dry, the system must be cooled and refilled with the relatively costly liquid cryogen before being commissioned. In some regions of the world, it is very difficult to obtain the large supplies of the liquid cryogen required for such an operation if not planned for in advance. Such a re-cooling and refilling is also time consuming, and costly both in terms of the time a field engineer must spend on site installing the system, and the material cost of the cryogen used.

In magnet systems such as that illustrated in FIG. 1, the volume of the cryogen tank 14 is largely defined by the minimum allowable shipping time. To allow a shipping time with the recondenser inoperable of, say, thirty days, a large volume of liquid cryogen must be accommodated in the system to ensure that it does not run dry during transit. The volume of this required cryogen reservoir plays a large part in determining the final size of the whole system.

SUMMARY OF THE INVENTION

The present invention addresses some of the problems of the prior art, to provide a cryogenic thermal battery arrangement for maintaining a superconducting magnet coil or similar apparatus at cryogenic temperature for a required shipping period, such as thirty days, without consuming a significant amount of costly cryogen. The present invention allows extended shipping periods without incurring excessive costs.

The present invention provides methods and apparatus for maintaining a system at cryogenic temperatures over an extended period, such as thirty days, without active refrigeration, and with reduced consumption of expensive cryogens such as liquid helium.

According to the present invention, a second cryogen different from the working cryogen is deployed in a tank, in thermal connection with the system to be cooled. When applied to the magnet system shown in FIG. 1, the tank may be placed in thermal connection with the former 10, and thermal connection to coils 12 may be achieved through, the former, for example as shown at 22 in FIG. 2.

The material of the second cryogen may be selected to be inexpensive, renewable and inexpensive to transport. It is therefore preferably a commonly used cryogen.

The tank containing the second cryogen is preferably arranged to be separate from the main cryogen vessel 14 for holding the working cryogen. This will prevent contamination of the working cryogen by eh second cryogen. Such contamination is inconvenient, and possibly dangerous. The second cryogen is preferably solid at the temperature of operation, and has a boiling point higher than the boiling point of the working cryogen. Using a system normally cooled by helium as an example, the working cryogen vessel 14 may be held at about 4K by boiling helium. In the tank of the invention, a second cryogen such as solid nitrogen may be housed. During normal operation, the helium boils to cool the system to about 4K; the recondensing refrigerator recondenses boiled-off helium vapour back to liquid form, and the second cryogen remains solid and plays no part in cooling.

During transport, the working cryogen—helium in this example—acts as a first thermal battery and boils to cool the system to its boiling point—about 4K for helium. After a certain period, this working cryogen will boil dry. The temperature of the system will begin to rise. This is the stage at which a prior art system would heat up to ambient temperature, leading to costly, time consuming and sometimes difficult re-cooling being required before installation. However, according to an aspect of the present invention, once the system has heated up to a certain, still cryogenic, temperature, the second cryogen in the tank will begin to change phase. For a second cryogen which is solid at the temperature of the working cryogen, the solid may begin to melt. This melting draws latent heat of fusion from its surroundings, cooling the system. Thus, the second cryogen acts as a second thermal battery. Once the second cryogen has melted, the temperature of the system will begin to rise again. Once the system has heated up to a certain, still cryogenic, temperature, the second cryogen in the tank will begin to change phase again. In this example, the liquid second cryogen may begin to boil. This boiling draws latent heat of evaporation from its surroundings, cooling the system. This represents a second thermal battery effect of the second cryogen. Once the second cryogen has boiled dry, the system will heat up to ambient temperature. However, by carefully selecting the material and quantity of the second cryogen provided in the system, this final stage of heating may be delayed such that a useful transit time may be allowed. Since the second cryogen does not need to maintain the system at its operating temperature, an inexpensive cryogen may be employed as the second cryogen.

In order to reduce the cost of the working cryogen consumed, its volume in the system is minimised. This may be by carefully controlling the initial fill of the system, or at least part of the working cryogen may be reclaimed from the cryostat prior to transport.

It may be advantageous to delay this final cooling stage until all, or almost all, of the second cryogen has boiled off. Alternatively, any remaining second cryogen may be recovered from the cryostat. This is to avoid the consumption of working cryogen in cooling the remaining volume of second cryogen. In the example of a nitrogen second cryogen with a helium working cryogen, cooling of a certain volume of nitrogen at 77K to 4K will require double that volume of helium, and is preferably avoided in the interest of reduced helium consumption.

If any second cryogen does remain within the cryostat, once it has been cooled to operating temperature then it does not drain any parasitic thermal load, but simply remains at operating temperature typically solidified and taking no part in the cryogenic cooling process. It is however preferable to minimise the mass of second cryogen remaining within the cryostat, since this will represent an additional thermal mass which will need to be cooled to operating temperature, resulting in unnecessary consumption of working cryogen.

Examples of possible second cryogens include, but are not limited to, nitrogen, neon, hydrogen, oxygen. Nitrogen is an attractive material to use as a second cryogen. It is very inexpensive and very abundant. It is neither explosive nor combustible. Nitrogen has useful physical properties as will be briefly discussed.

Nitrogen finds stable temperatures at 35K, 70K and 77K as latent heat is absorbed. As nitrogen undergoes one more phase change than most cryogens, it is an effective cryogen in this application. The volume of a certain mass of solid nitrogen at under 35K is about 0.8% less than its volume as a liquid.

As the temperature rises to 35K, solid nitrogen undergoes a solid-solid phase change, absorbing latent heat. At 70K, nitrogen melts to become a liquid, absorbing latent heat again. Nitrogen boils at 77K under atmospheric pressure, again absorbing latent heat. At temperatures above 77K and under atmospheric pressure, nitrogen is a gas.

When solid nitrogen is used as a second cryogen, therefore, much thermal heat must be absorbed from the surroundings before it boils. The specific heat capacity of nitrogen is relatively large compared to other candidates such as hydrogen, neon or oxygen.

If the system of the present invention is cooled by a nitrogen second cryogen, after the working cryogen has boiled off, the system may heat to one of these transition temperatures—35K, 70K or 77K, but it will be much less difficult to cool the system from one of these temperatures back to 4K than to cool from ambient (in the region of 300K). As the system may be held at a cryogenic temperature by the second cryogen, there is less need for costly cryogen such as liquid helium to be provided for transport. The volume of the working cryogen vessel 14 may accordingly be reduced, with reduced cost for filling, and a smaller overall system. The system will become lighter, and the requirement for liquid cryogen in the tank will be reduced. In a known system, a required cryogen fill of 1500 liters of liquid helium would weigh 400 kg, and would cost about £3300 at current prices. According to the present invention, the equivalent system could be shipped with 100 liters of nitrogen, weighing 80 kg, to provide equivalent cooling at minimal material cost. For example, a system may be cooled to operating temperature by boil off of 100 liters of liquid nitrogen, followed by boil off of a minimum quantity of working cryogen required to cool the system from the boiling point of nitrogen to the boiling point of the working cryogen.

Since nitrogen requires a large amount of energy to heat up from 4K to above 77K, it is an effective cryogen. In terms of simple latent heat capacity of evaporation, 10 liters of liquid nitrogen absorb latent heat of evaporation equal to that absorbed by 55 liters of boiling helium. Thus, a given mass of nitrogen may be seen to be over five times as effective at cooling at its boiling point as an equivalent mass of helium. Of course, the boiling points of the cryogens are different, so that boiling helium will hold a temperature of 4K, while boiling nitrogen will hold a temperature of 77K. As described above, nitrogen has a solid phase transition in addition to melting and boiling transitions. Heating nitrogen from below 35K to above 77K requires ten times as much energy as required for heating the same mass of helium over the same temperature range. Thus, for the same cooling effect, one-tenth of the volume of nitrogen may be used as compared to an equivalent thermal battery using helium as the cryogen. For example, if a cryogenic system currently requires an inventory of 1500 liters of liquid helium to ensure a permissible transit time of thirty days, the same transit time may be provided with an inventory of 150 liters of nitrogen. The overall system may then be reduced in size, since the cryogen vessel 14 need not be so large, and the expense of transporting and installing the system is reduced, since large quantities of liquid helium are no longer required. In another example, the total volume of cryogen may be kept the same but a proportion of the helium may be replaced by nitrogen. For a cryogen volume designed to provide boiling helium cooling for up to 31 days, it has been calculated that replacing one-third of the volume of helium with nitrogen would provide in transit cooling at boiling helium temperature for 20 days, followed by cooling at liquid or boiling nitrogen temperature for 120 days—a transit time far in excess of those provided by present arrangements. A disadvantage of such an arrangement is that the system may be at a temperature of up to 77K on arrival, instead of 4K as would be the case with a system cooled only by boiling helium.

Once the system has arrived on site, it is relatively simple to cool from 77K to 4K, for instance by using an on-site closed loop refrigerator. The closed loop refrigerator may require a helium charge of only about three liters. Further explanation of a closed loop refrigerator will be described below. Alternatively, the system may be cooled by direct contact refrigeration of the former 10, or by addition and boil off of working cryogen.

Other objects, advantages and novel features of the present invention will become apparent from the following detailed description of the invention when considered in conjunction with the accompanying drawings.

BRIEF DESCRIPTION OF THE DRAWINGS

Certain specific examples of a cryostat according to the present invention will now be described in connection with the figures of the drawing, in which.

DETAILED DESCRIPTION OF THE INVENTION

Figure 1:
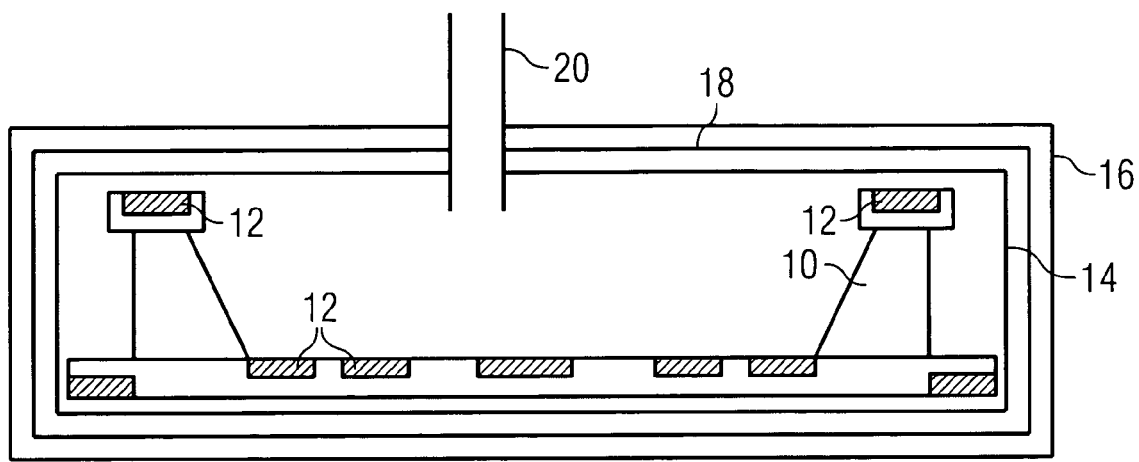
FIG. 1 shows a cross-section of a magnet system suitable for use in an embodiment of the invention.
Figure 1:
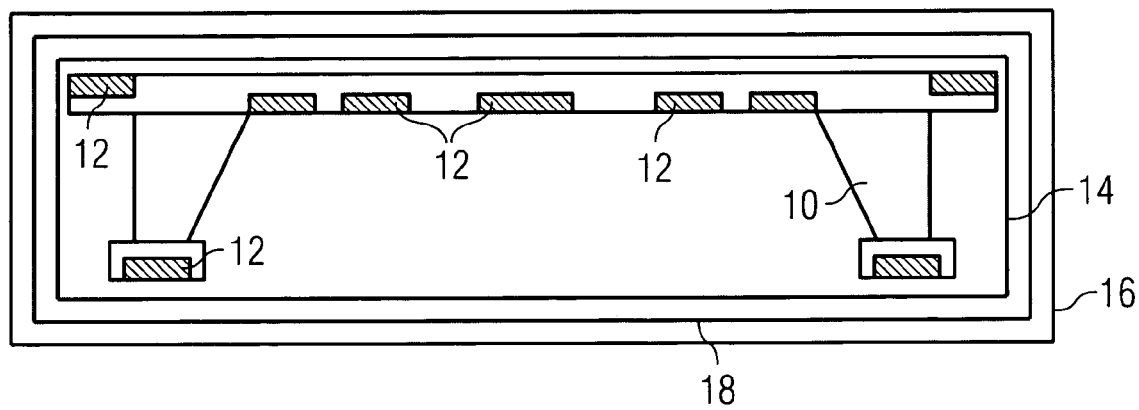

In the simplest embodiment of the present invention, the structure of FIG. 1 is unchanged. The cryogen vessel 14 is partially filled with a second cryogen, such as nitrogen. This may be achieved by filling with liquid nitrogen, or by operating an associated recondensing refrigerator to liquid nitrogen temperature and leaving the cryogen vessel open to an appropriate source of nitrogen. Once a required volume of second cryogen has been introduced, a required volume of working cryogen such as helium is introduced. The system may now be held at operating temperature by an associated recondensing refrigerator. The second cryogen will remain solid within the cryogen vessel, and will take no active part in maintaining the system at operating temperature.

If the recondensing refrigerator stops for some reason, for example because the system is being transported, the working cryogen will boil off, cooling the system. If the working cryogen boils dry, the second cryogen will begin to melt, then boil, providing cryogenic cooling over an extended time period, at the boiling point of the second cryogen.

Figure 2:
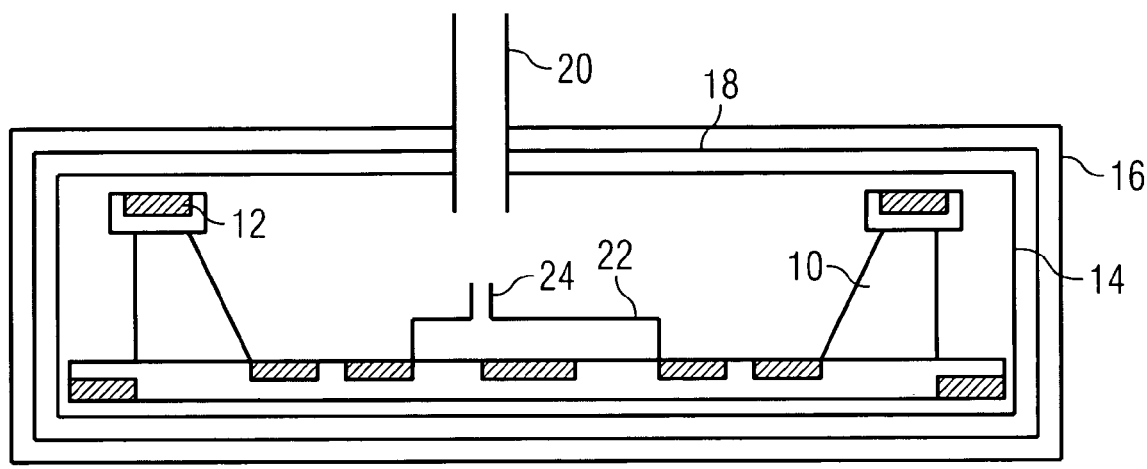
FIG. 2 shows a cross-section of a magnet system according to another embodiment of the invention.
Figure 2:
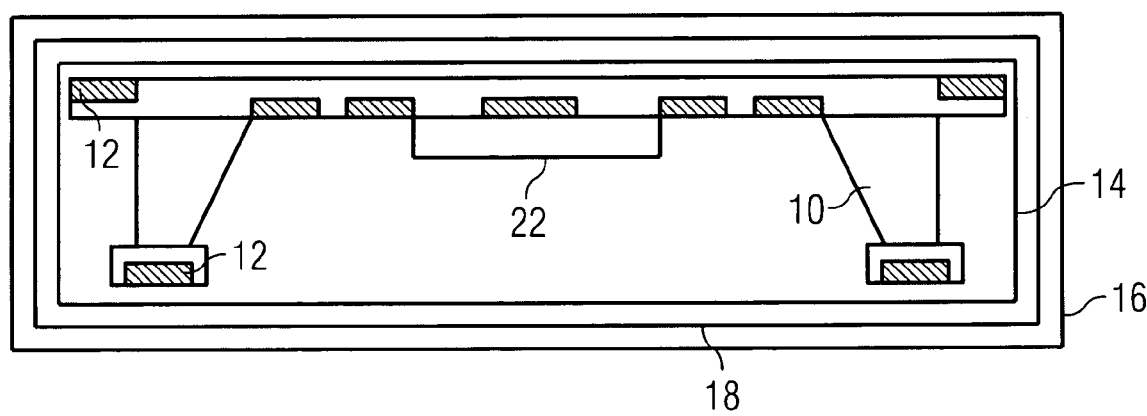

FIG. 2 shows another embodiment of the invention. A second cryogen tank 22 is provided, around the former 10 and in thermal contact with it. The tank may be filled with second cryogen through access neck 24 by a method as mentioned above. The use of the tank for cooling the system is as for the embodiment described above, except that the second cryogen is held in thermal contact with the former, by second cryogen tank 22, giving efficient cooling of the coils 12. The provision of second cryogen tank 22 retains the second and working cryogens separately, and avoids any contamination of the working cryogen by the second cryogen. When emptied, the second cryogen tank 22 may serve as a displacement volume. This will allow a given depth of working cryogen to be provided in the cryogen tank with a correspondingly reduced volume of cryogen, or, alternatively, a conventional volume of cryogen may be introduced into the tank, to immerse the superconducting magnet assembly to a greater depth. This would ensure that a greater proportion of the superconducting magnet is cooled by contact with the liquid cryogen, providing more constant cooling.

The tank 22 may be filled by the following process. Access to the tank 22 is connected to a suitable source of nitrogen. The former 10 is cooled by a refrigerator according to any known arrangement. This cooling cools the walls of the tank 22 to below the boiling point of nitrogen. Nitrogen begins to condense on the inside of the tank. The vacuum caused by the condensation of the nitrogen draws more nitrogen into the tank. A nitrogen thermal battery may thus be self filling: as the tank is cooled, nitrogen liquefies then solidifies, drawing more nitrogen gas in.

Figure 3:
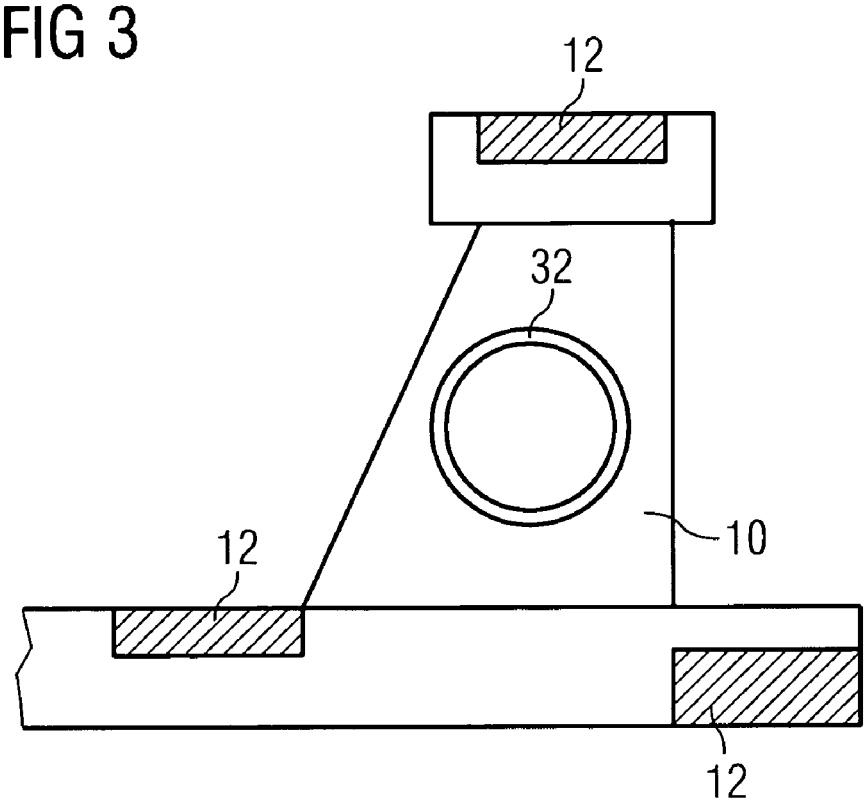
FIG. 3 shows a detail of a portion of FIG. 2.

FIG. 3 shows one end of the former in detail, modified according to another embodiment of the invention. In this embodiment, in order to achieve good thermal contact with the coils 12, a tank 32 is provided as an integral part of the former. As illustrated, the tank is of toroidal form, coaxial with the former 10, and is braised or welded to the former at appropriate points. Tank 32 may be filled by the method described with reference to tank 22 of FIG. 2.

Figure 4:
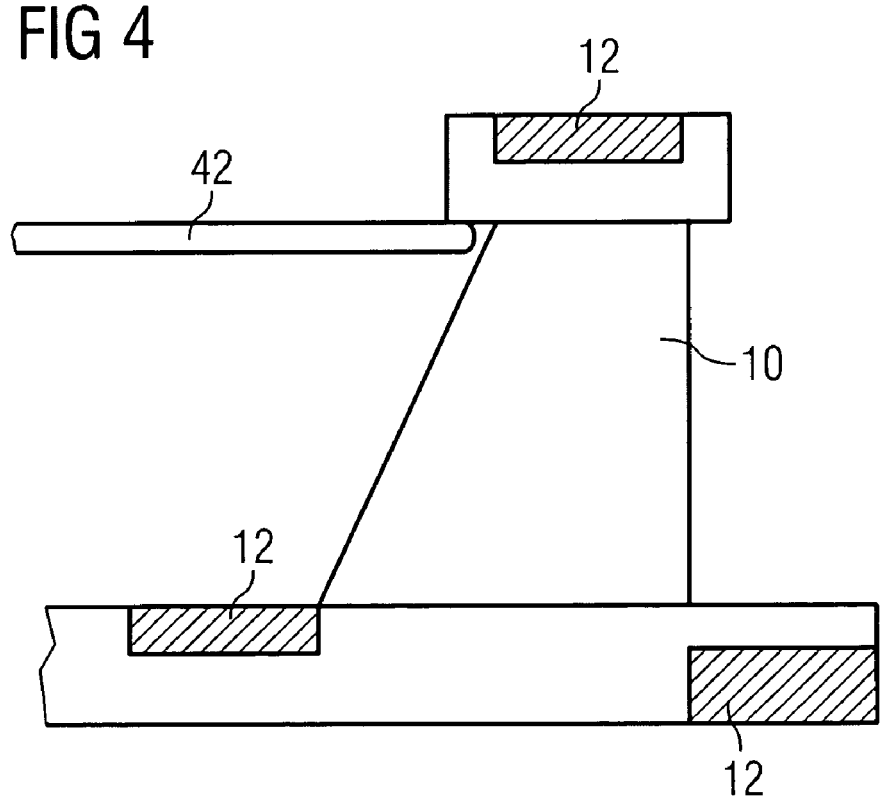
FIG. 4 shows a detail of another embodiment of the invention.

FIG. 4 shows one end of the former in detail, modified according to another embodiment of the invention. In this embodiment, in order to achieve good thermal efficiency of the system, a tank 42 is provided in the form of a thermal shield, but also in thermal contact with the former. As illustrated, the tank is of cylindrical form, co-axial with the former 10, and is braised or welded to the former at appropriate points. By making the tank 42 a full cylinder about the magnet's axis, attached to the former 10 at each end, the heat load onto the cooled former 10 is reduced as the tank 42 acts to shield at least some of the coils 12 and former 10 from incoming thermal radiation. If nitrogen is used as the second cryogen, the tank 42 should preferably be made of aluminium, since aluminium has emissivity characteristics at low temperatures, which are beneficial here. The tank 42 may be filled by a process similar to that described with reference to FIG. 2.

Figure 5:
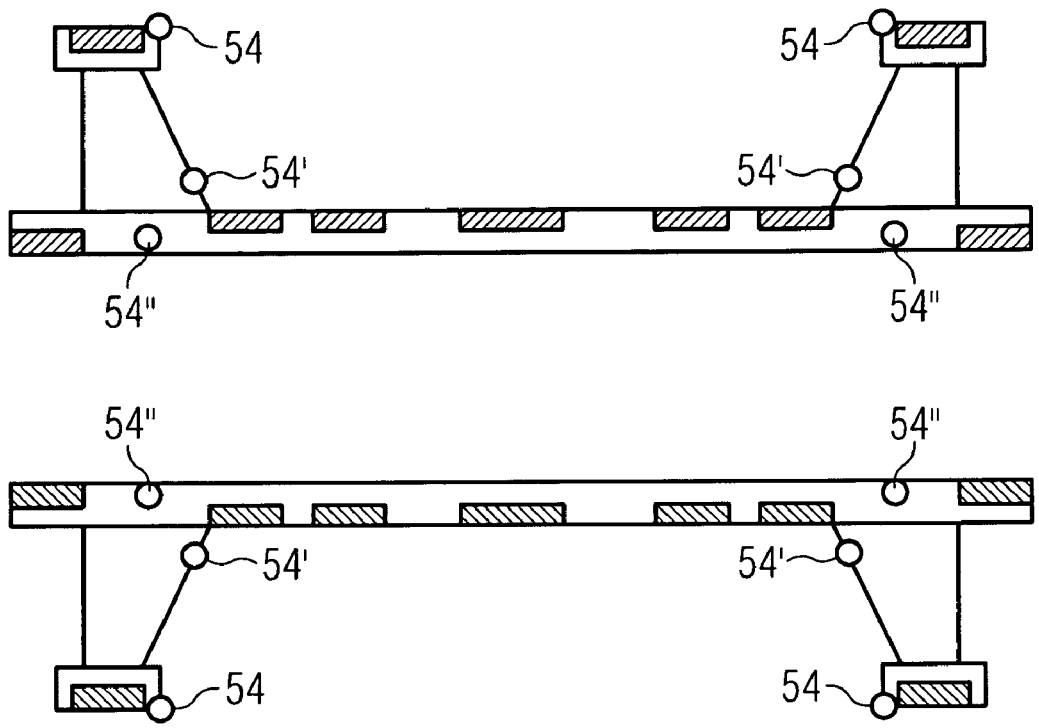
FIG. 5 illustrates an embodiment of the invention in which the cryogen vessel and the outer vacuum container have been omitted.

The coils 12 and former 10 may be cooled by inclusion in a cryogen vessel such as illustrated in FIGS. 1 and 2. However, an alternative arrangement for cooling the former and coils 12 down to operating temperature is illustrated in FIG. 5, which illustrates closed-loop refrigeration but does not itself illustrate an embodiment of the present invention.

In its simplest form, a closed loop refrigerator may comprise a loop of tube of a thermally conductive material, whose ends are connected to a recondensing refrigerator. The recondensing refrigerator should be arranged at the top of the loop. The tube is placed in thermal contact with the article to be cooled, and is at least partially filled with a liquid cryogen. Heat is absorbed through the material of the tube and results in the boiling of a proportion of the cryogen. The boiled off cryogen gas travels upwards to the recondensing refrigerator. The refrigerator cools the cryogen gas and recondenses it back into a liquid, which runs back through the tube. By suitable arrangement of the refrigerator and the loop of tube, a circulation current may be established around the loop. Being a closed loop system, this arrangement can cool apparatus to the boiling point of the cryogen used, but does not consume cryogen in operation, and requires only a small charge of cryogen.

The second cryogen provided according to the present invention should be cooled to operating temperature by active cooling, for example using a closed loop refrigeration system.

The alternative, to cool the second cryogen to the operating temperature by addition of working cryogen, may be economically unsound. For example, to cool nitrogen to 4K by addition of liquid helium would require a quantity of helium double the volume of the nitrogen cooled. No cost saving would be made.

As can be seen from FIG. 5, no cryogen vessel 14 or outer vacuum container 16 are required. A coolant tube 54 containing a liquid coolant such as liquid helium is provided in thermal contact with former 10. The coolant tube may comprise one or more toroidal hoops braised or welded onto the former 10 at appropriate positions. Alternative or additional positions for cooling tubes are shown at 54' and 54". A refrigerator is connected to cool and pass a cryogenic coolant through these cooling tubes, forming a closed loop refrigeration system. Because no cryogen tank is required, the overall system may be made significantly smaller. The only working cryogen required in such embodiments is the cryogen required to fill cooling tube 54. This may have a volume of the order of three liters. Of course, such a small volume of working cryogen cannot be expected to maintain the system at a cryogenic temperature for any significant amount of time when operating as a thermal battery in the absence of external refrigeration. By combining this arrangement with a tank of second cryogen according to an embodiment of the present invention, the system may be maintained at a cryogenic temperature for many days. The tank arrangement of FIG. 4 may be particularly advantageously applied to such embodiments, as it would provide thermal shielding which may otherwise be lacking.

Once cooled to operating temperature, in operation of the magnet in persistent mode, coils may be cooled by thermal conduction or by thermosiphon cooling. Both of such methods may be realised with a closed loop system requiring a small cryogen inventory.

A significant advantage of the present invention is that one may be confident of the state of a cryogenic system upon delivery. Provided that delivery takes place within the determined maximum delivery time, which may be extended beyond the normal range by the present invention without incurring penalties in terms of cost or size of the equipment, one may be sure that the system will be cooled to 77K or below. It will be necessary to then expend a certain amount of working cryogen, such as liquid helium on cooling the system from 77K to the operating temperature, 4K in this example, but this amount of helium may be accurately estimated and provided for in advance. In the prior art systems, one may have expected the system to arrive still cooled by boiling helium, and requiring a helium top-up of about 400 liters, say. If there is a delay in shipping, the system may in fact arrive at ambient temperature, and require initial nitrogen cooling plus a large quantity of liquid helium to put the system in an operable condition. Such large volumes of cryogen may not be readily available at the desired installation site.

Certain cryogens, for example nitrogen, have a low thermal conductivity in their solid state. When such a cryogen is operating as a thermal battery, outer regions of the cryogen may melt, and even boil, before sufficient heat has reached other parts of the cryogen to melt it. This may result in ineffective cooling. On the other hand, such effect may be advantageous if a lower rate of cooling is required over a more extended time period. According to certain embodiments of the invention, thermally conductive paths may be provided within the solid cryogen, to improve contact surface area of the second cryogen. For example, a second cryogen tank such as shown at 32 in FIG. 3 or at 42 in FIG. 4, may be partly filled with a thermally conductive open-celled material, such as copper wool. Such material would disperse heat more evenly through the second cryogen, and allow a more even heating of the second cryogen, and a more constant rate of cooling to the cooled system. Finned structures, akin to heat sinks found on electrical equipment, may alternatively or additionally be provided inside the second cryogen tanks for the same purpose. This is particularly effective if the second tanks are manufactures by an extrusion process, for example using aluminium. By controlling the material and density of such thermally conductive structures, the rate and uniformity of cooling provided by the second cryogen may be adapted to suit the required application.

Figure 6:
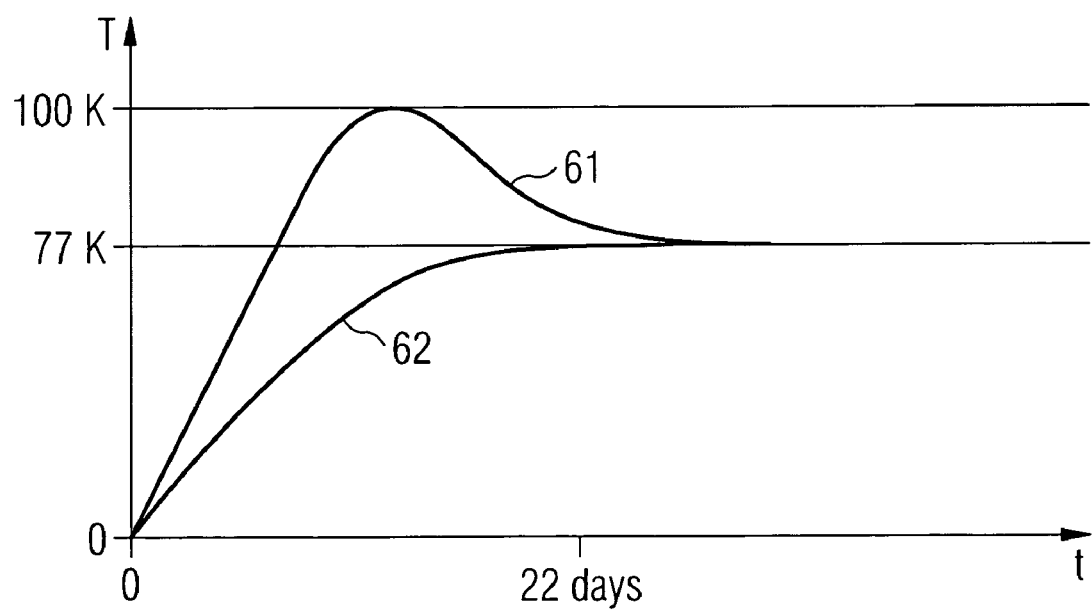
FIG. 6 illustrates temperature curves which may be obtained according to certain embodiments of the present invention.

FIG. 6 illustrates temperature curves which may be obtained with a nitrogen second cryogen, according to certain embodiments of the present invention. A first curve 61 illustrates the temperature variation over time of an example superconductive magnet cooled by a nitrogen second cryogen in a tank according to an embodiment of the present invention. As can be seen, the temperature of the magnet may rise above the boiling point of the second cryogen, due to the poor thermal conductivity of the cryogen in its solid state. A second curve 62 illustrates the temperature variation over time of the example superconductive magnet cooled by an otherwise identical tank of nitrogen second cryogen, which tank is partially filled with an open celled thermally conductive material such as copper wool. As seen in FIG. 6, the cooling is more effective, maintaining the temperature of the magnet below 77K at all times. This arrangement is critically damped; it just avoids heating to temperatures above 77K and ensures that the cryostat will be stable at boiling nitrogen temperature for a significant period of time, beginning at around 22 days, a typical shipping time. Certain applications may require a certain time constant. By adapting the provision of thermally conductive material within the cryogen tank, effectively varying the surface area of the solid cryogen, an optimal time constant for a particular application may be obtained.

While the present invention has been described with reference to a limited number of specific embodiments, it will be clear to one skilled in the art that other modifications and variations of the present invention may be made within the scope of the invention as defined in the appended claims.

For example, while the present invention has been described with particular reference to nitrogen as the second cryogen, other cryogens may be used. The second cryogen chosen should have a high heat capacity when frozen, and preferably should also have a high latent heat capacity in its phase changes. The chosen second cryogen should not expand as it solidifies. If a second cryogen is chosen which does expand on solidifying, then the tank containing it must either relax to accommodate the expanding contents, or must be strong enough to withstand the pressure put on it by the expanding cryogen.

Furthermore working cryogens other than helium may be used.

While the invention has been particularly described with reference to superconductive magnets for MRI systems, the present invention may be applied to the cooling of other equipment.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A thermal battery for maintaining an article at a cryogenic temperature for a required shipping period, by absorption of heat into the thermal battery, wherein the thermal battery comprises a first component and a second component, each in thermal contact with the article,
said first component comprising a first cryogen which serves to hold the article at a first temperature by boiling of the first cryogen,
said second component comprising a second cryogen which is held at the first temperature by said boiling of the first cryogen, the second cryogen serving to hold the system at a second temperature, higher than the first temperature, after the first cryogen has boiled dry.

2. A thermal battery according to claim 1 wherein the first temperature is the boiling point of the first cryogen, and the second temperature is the boiling point of the second cryogen.

3. A thermal battery according to claim 1 wherein the first temperature is the boiling point of the first cryogen, and the second temperature is the melting point of the second cryogen.

4. A thermal battery according to claim 1 wherein the first temperature is the boiling point of the first cryogen, and the second temperature is a solid phase transition temperature of the second cryogen.

5. A thermal battery according to claim 1, wherein the thermal battery comprises a cryogen tank for holding the first cryogen and the second cryogen is accommodated within the cryogen tank, in contact with the first cryogen.

6. A thermal battery according to claim 1, wherein the thermal battery comprises a first cryogen tank for holding the first cryogen and a second cryogen tank for holding the second cryogen in thermal contact with a part of the article, such second cryogen tank being separate from the first cryogen tank.

7. A thermal battery according to claim 6, wherein the second cryogen tank is integrated within the part of the article.

8. A thermal battery according to claim 6 wherein the second cryogen tank is formed as a thermal shield, substantially enclosing a part of the article, thereby substantially blocking thermal radiation from reaching the part of the article.

9. A thermal battery according to claim 1, wherein the second component is formed by a tank containing the second cryogen, said tank being least partly filled with finned structures, a thermally conducting mesh or open-celled filler of thermally conductive material.

10. A thermal battery according to claim 1, arranged to cool a substantially cylindrical former for a solenoidal magnet,
wherein the second component is formed by a tank containing the second cryogen, which is attached by an outer surface in thermal and mechanical attachment with the former, the former comprising an inner part of first diameter and at least one outer part of a second diameter, greater than the first diameter,
wherein the tank is substantially toroidal or cylindrical in shape, and is coaxial with the former, the tank being substantially housed within a substantially cylindrical volume, said volume being coaxial with the former, and having an outer diameter equal to the second diameter, and an inner diameter equal to the first diameter.

11. A thermal battery according to claim 1, wherein the second cryogen substantially comprises nitrogen.

12. A magnetic resonance imaging (MRI) system, comprising superconducting coils wound around a thermally conductive former, said coils and said former being arranged to be cooled by a thermal battery according to claim 1.

13. A method for transporting apparatus at a cryogenic temperature, including the steps of:
providing a second cryogen in a tank, in thermal connection with the apparatus; and
adding a first cryogen, in thermal connection to the apparatus and the second cryogen, to maintain the apparatus and the second cryogen at a first cryogenic temperature by boiling of the first cryogen;
maintaining the apparatus at the first cryogenic temperature until the first cryogen has boiled dry; and
after the first cryogen has boiled dry, allowing the second cryogen to change phase, thereby maintaining the apparatus at a second cryogenic temperature, higher than said first cryogenic temperature, being a phase transition temperature of the second cryogen.

14. A method according to claim 13, further comprising the step of cooling the second cryogen by use of a closed loop refrigerator, prior to the addition of the first cryogen.

15. A method according to claim 13 wherein the phase transition is the boiling of the second cryogen.

16. A method according to claim 13 wherein the phase transition is the melting of the second cryogen.

17. A method according to claim 13 wherein the phase transition is a solid phase transition of the second cryogen.

* * * * *